United States Patent
Chou

[19]

[11] Patent Number: 5,985,715
[45] Date of Patent: Nov. 16, 1999

[54] METHOD OF FABRICATING STACKED TYPE CAPACITOR

[75] Inventor: Kuo-Yu Chou, Hsinchu Hsien, Taiwan

[73] Assignee: Winbond Electronics Corp., Taiwan

[21] Appl. No.: 09/040,259

[22] Filed: Mar. 17, 1998

[30] Foreign Application Priority Data

Dec. 1, 1997 [TW] Taiwan .................................. 86118031

[51] Int. Cl.$^6$ ................................................. H01L 27/108
[52] U.S. Cl. ......................... 438/254; 438/256; 438/397; 438/399; 117/7
[58] Field of Search ..................................... 438/396, 397, 438/398, 399, 954, 253, 254, 255, 256; 177/4, 7, 8, 9

[56] References Cited

U.S. PATENT DOCUMENTS

| | | | |
|---|---|---|---|
| 4,811,076 | 3/1989 | Tigelaar et al. | 357/51 |
| 5,405,801 | 4/1995 | Han et al. | 437/60 |
| 5,478,768 | 12/1995 | Iwasa | 437/52 |
| 5,811,332 | 9/1998 | Chao | 438/396 |
| 5,909,045 | 6/1999 | Chao | 257/308 |

*Primary Examiner*—Benjamin Utech
*Assistant Examiner*—Matthew Anderson
*Attorney, Agent, or Firm*—Thomas, Kayden, Horstemeyer & Risley, LLP

[57] ABSTRACT

A method of fabricating a stacked type capacitor. A semiconductor substrate having a transistor, a field oxide layer, and a conductive layer formed on top of the field oxide layer is provided. The transistor comprises a gate and a source/drain region. A first dielectric layer is formed over the substrate. An oxide layer is formed over the first dielectric layer. A second dielectric layer is formed on the oxide layer. An etching step is performed to the second dielectric layer to form an opening therein. A first poly-silicon layer is formed on the second dielectric layer and the opening. The first poly-silicon layer is etched back to remove a part of the first poly-silicon layer. A first spacer is formed on a wall of the opening. The oxide layer is etched for a first height by using the first spacer and the second dielectric layer as a first mask. A second poly-silicon layer is formed on the second dielectric layer and the opening. An etching back is performed to the second poly-silicon layer to remove a part of the second poly-silicon layer. A second spacer is formed on a wall of the first height in the opening. The oxide layer is etched for a second height by using the first spacer, the second spacer, and the second dielectric layer as a second mask, and a third spacer is formed. The first dielectric layer is formed to expose the source/drain region. Selective epitaxy growth is performed to form an epitaxy layer on the first spacer, the second spacer, and the third spacer. The second dielectric layer and the oxide layer are removed to form a bottom electrode. A third dielectric layer is formed on the bottom electrode. A top electrode is formed on the third dielectric layer.

21 Claims, 9 Drawing Sheets

METHOD OF FABRICATING STACKED TYPE CAPACITOR

CROSS-REFERENCE TO RELATED APPLICATION

This application claims priority benefit of Taiwan application Serial no. 86118031, filed Dec. 1, 1997.

BACKGROUND OF THE INVENTION

1. Field of the Invention

The invention relates to a method of fabricating an dynamic random access memory (DRAM), and more particularly to a method of fabricating a capacitor with a higher capacitance in a DRAM, by increasing surface area of an electrode.

2. Description of the Related Art

Figure 1:
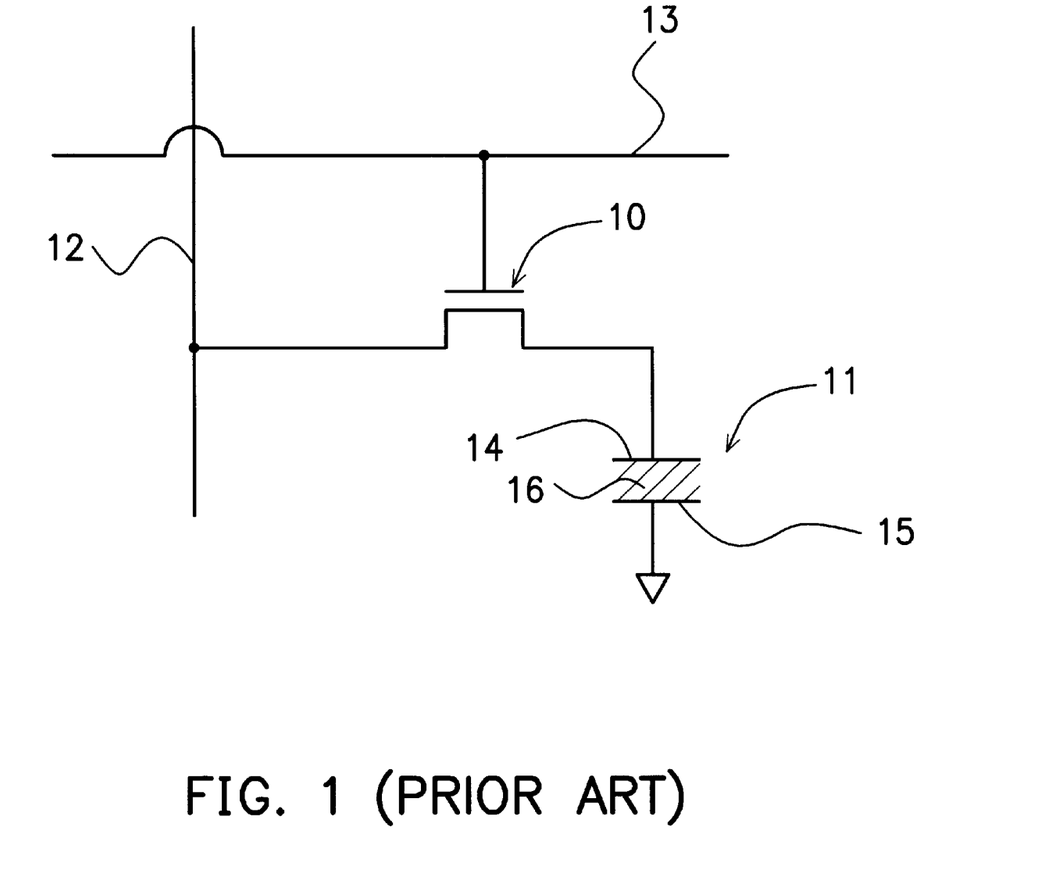
FIG. 1 shows a circuit diagram of a conventional DRAM.

As the function of a microprocessor becomes more and more powerful, the program and calculation of a software becomes more and more complicated, and thus, the required capacitance of a memory is larger and larger. FIG. 1 shows a circuit diagram of a conventional DRAM. A memory cell comprises a transfer transistor 10 and a storing capacitor 11. The source region of the transfer transistor 10 corresponds to a bit line 12, whereas the gate corresponds to a word line 13. The drain region of the transfer transistor 10 connects with the storing electrode 14, that is, the bottom electrode of the capacitor 11. The plate electrode 15, that is, the top electrode or the cell electrode, connects with a constant voltage source. A dielectric layer is formed between the storing electrode and the plate electrode.

The capacitor is the heart for storing input signal in a DRAM. For a large amount of charges to be stored in a capacitor, it is more frequent that an soft error is caused by noise, such as an α particle, during data access, and therefore, the refresh frequency is reduced. Several ways are available to increase the storing capacitance of a capacitor. (1) Using a dielectric layer with a higher dielectric constant, the storing charge per unit area is increased. (2) To decrease the thickness of the dielectric layer, a higher capacitance can be obtained. However, the quality of the dielectric layer restricts the thickness of the dielectric layer to a certain value. (3) By increasing the surface area of a capacitor, the amount of charges stored in a capacitor is increased. However, with increasing the surface area of a capacitor, the integration of a device is decreased.

For a conventional DRAM with a smaller amount of storing charges, a two dimensional planar type capacitor is adapted in a integrated circuit. The planar type capacitor occupies a sizeable surface area on the substrate, and therefore, not suitable for the use in a high integrated circuit. To achieve a high integration, a three dimensional structure of a capacitor, such as a stacked type or a trench type capacitor is adapted. However, as the integration becomes further higher, a pure three dimensional capacitor can not meet the requirement to be used. A method of increasing capacitance in a small area of a capacitor in a DRAM is developed.

Figure 2A:
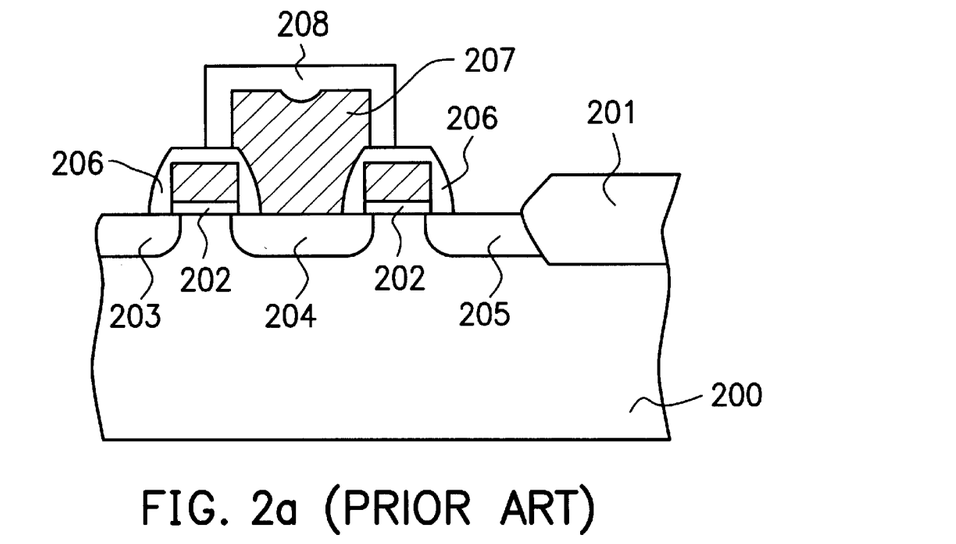
FIG. 2 shows a conventional method of fabricating a trench type capacitor in a DRAM.
Figure 2B:
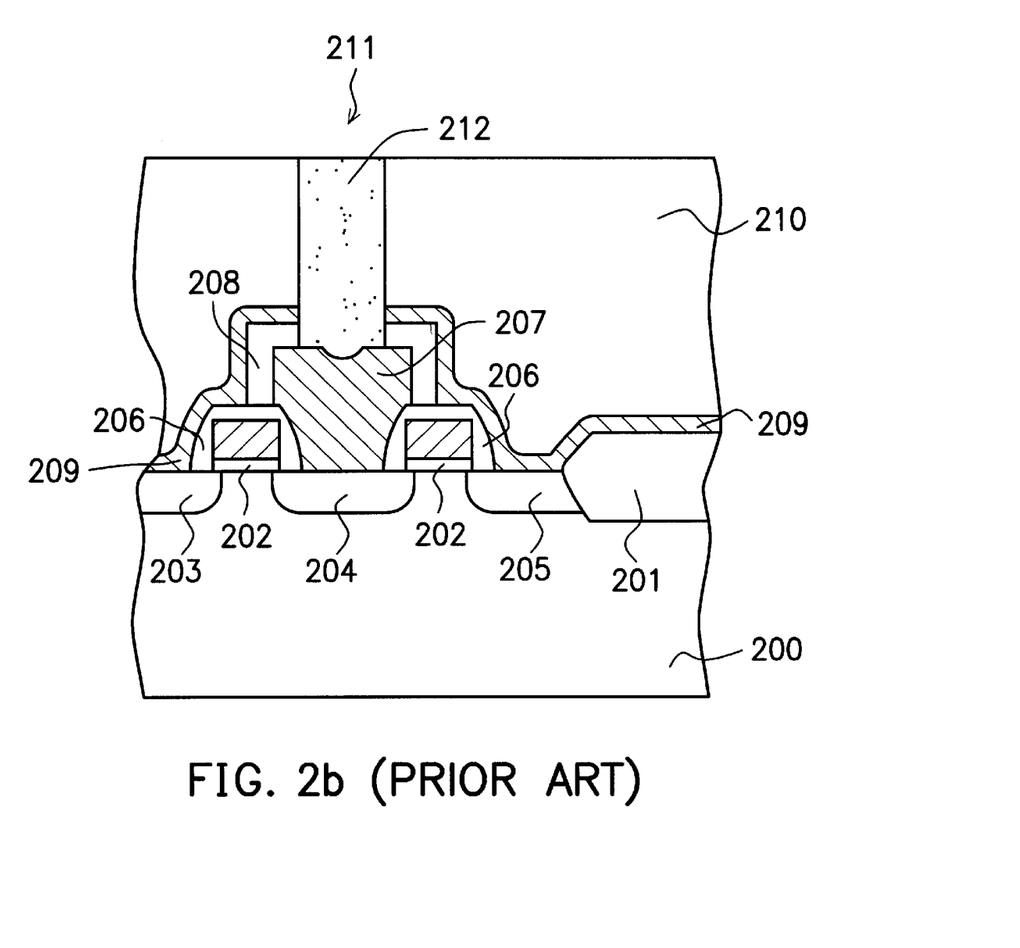

Referring to FIG. 2a to FIG. 2b, a conventional method of fabricating a trench type capacitor in a DRAM is shown. Referring to FIG. 2a, a substrate 200 having a field oxide 201, a gate 202, an exposed source/drain regions 203, 204, 205, and a first insulation layer 206 to cover the gate 202 formed thereon is provided. A first poly-silicon layer is formed and defined to form a bit line 207 coupled with the source/drain region 204. A second insulation layer 208 is formed and patterned to cover the bit line 207 only, and expose the source/drain regions 204, 205.

Figure 2C:
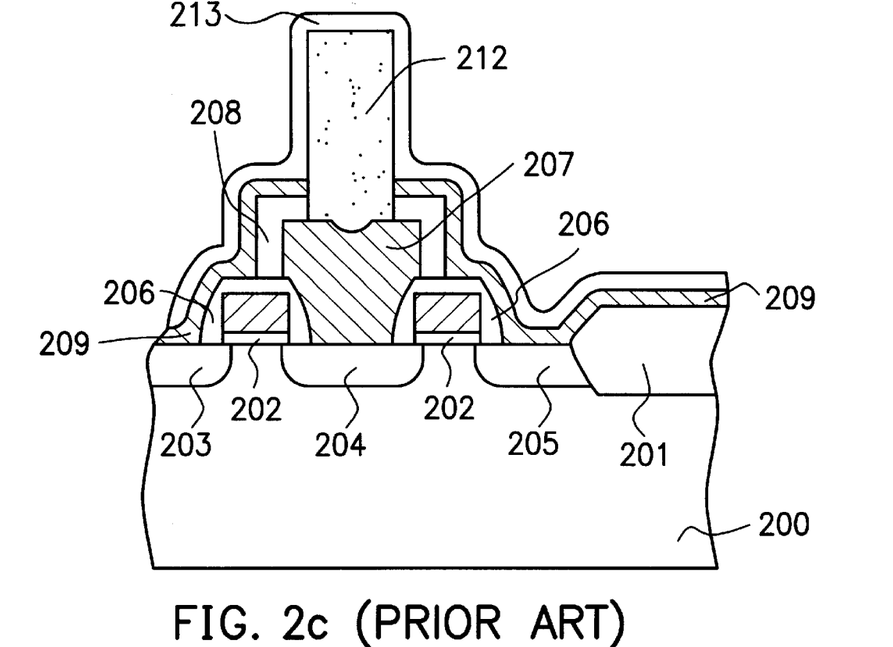
Figure 2D:
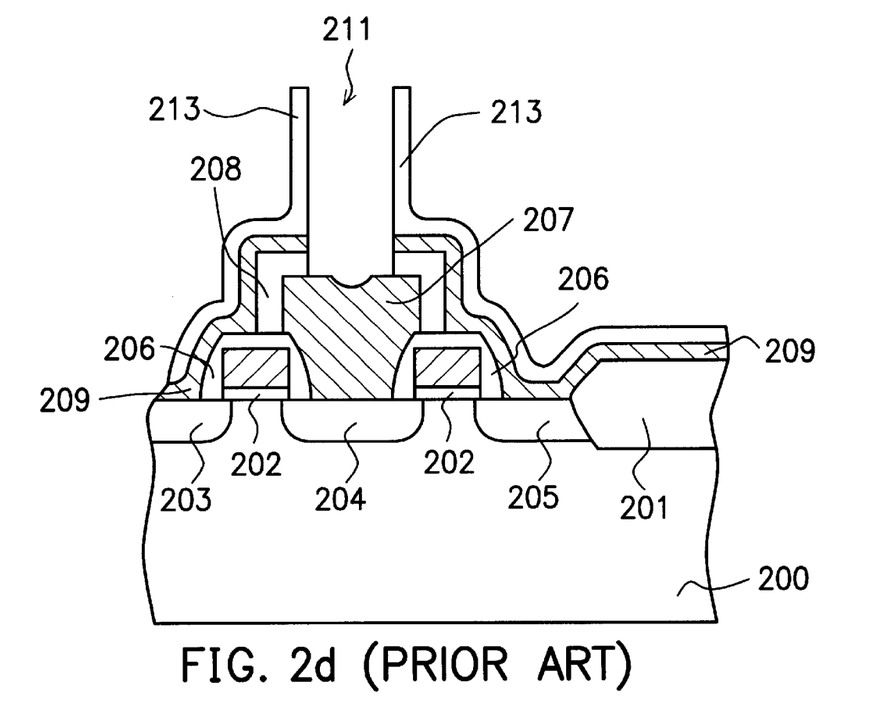

Referring to FIG. 2b, a thin and doped second poly-silicon layer 209 is formed and coupled with source/drain regions 203, 205. A photo-resist layer 210 is formed on the second poly-silicon layer 209. A via 211 is formed by patterning the photo-resist layer and penetrates through the photo-resist layer 210, the second poly-silicon layer 209, and the second insulation layer 208. The via 211 is filled with an oxide layer 212. Referring to FIG. 2c, the photo-resist 210 is removed and a third poly-silicon layer 213 is formed. Referring to FIG. 2d, the third poly-silicon layer 213 on the oxide layer 212 is removed to expose the oxide layer 212. The oxide layer 212 is removed, and a storing electrode coupled with the source/drain region 204 is formed. After the formation of a dielectric layer and a fourth poly-silicon layer as a plate electrode, a capacitor is formed. The subsequent metallization and insulation protection process are then performed to complete the fabrication of a DRAM.

Figure 3:
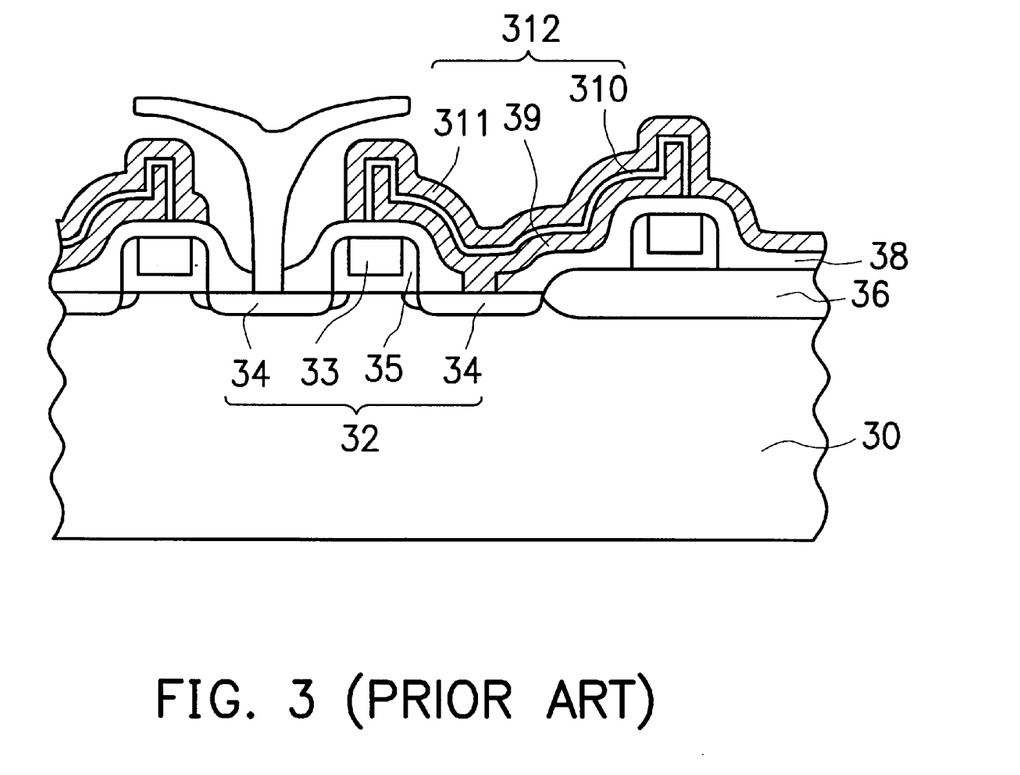
FIG. 3 is a cross sectional view of a conventional stacked type capacitor in a DRAM.

Referring to FIG. 3, the cross sectional view of a conventional stacked type capacitor in a DRAM is shown. A substrate 30 having a metal-oxide-semiconductor (MOS) 32 comprising a gate 33, a source/drain region 35 and a spacer is provided. On the substrate 30 with a field oxide layer 36 and a conductive layer 37 formed thereon, an insulation layer 38 is formed. A contact window is formed by etching the insulation layer 38 to exposed the drain/source region 34. A bottom electrode 39, a dielectric layer 310, and a top electrode 311 is formed on the contact window in sequence to form a stacked type capacitor 312. The dielectric layer is, for example, an oxide/nitride/oxide (ONO) layer. The bottom electrode 39 and the top electrode 311, for example, are poly-silicon. The bottom electrode has an accidented topography. After the subsequent process of metallization and insulation protection, a DRAM is fabricated.

The capacitor in a conventional DRAM adapts an accidented topography, that is, an uneven surface to obtain a higher capacitance. The disadvantage is that the degree to increase is limited. For a even higher requirement of capacitance, or a device with further smaller dimension, this kind of capacitor does not meet the requirement for application. Moreover, to fabricate a stacked type capacitor, quite a few photo-masks are used, and therefore, the process is more complex and the fabricating cost is increased.

SUMMARY OF THE INVENTION

It is therefore an object of the invention to provide a method of fabricating a stacked capacitor in a DRAM. The surface area of a capacitor is increase to obtain with a higher capacitance. In addition, the capacitor can be applied to a device with a small dimension.

It is therefore another object of the invention to provide a method of fabricating a stacked capacitor in a DRAM. Only one step of photolithography is used, so that the process of fabrication is simplified and the fabricating cost is decreased.

To achieve these objects and advantages, and in accordance with the purpose of the invention, as embodied and broadly described herein, the invention is directed towards a method of fabricating a stacked type capacitor. A semiconductor substrate having a transistor, a field oxide layer, and a conductive layer formed on top of the field oxide layer is provided. The transistor comprises a gate and a source/drain region. A first dielectric layer is formed over the substrate. An oxide layer is formed over the first dielectric layer. A second dielectric layer is formed on the oxide layer.

An etching step is performed to the second dielectric layer to form an opening therein. A first poly-silicon layer is formed on the second dielectric layer and the opening. The first poly-silicon layer is etched back to remove a part of the first poly-silicon layer. A first spacer is formed on a wall of the opening. The oxide layer is etched for a first height by using the first spacer and the second dielectric layer as a first mask. A second poly-silicon layer is formed on the second dielectric layer and the opening. An etching back is performed to the second poly-silicon layer to remove a part of the second poly-silicon layer. A second spacer is formed on a wall of the first height in the opening. The oxide layer is etched for a second height by using the first spacer, the second spacer, and the second dielectric layer as a second mask, and a third spacer is formed. The first dielectric layer is formed to expose the source/drain region. Selective epitaxy growth is performed to form an epitaxy layer on the first spacer, the second spacer, and the third spacer. The second dielectric layer and the oxide layer are removed to form a bottom electrode. A third dielectric layer is formed on the bottom electrode. A top electrode is formed on the third dielectric layer.

It is to be understood that both the foregoing general description and the following detailed description are exemplary and explanatory only and are not restrictive of the invention, as claimed.

DESCRIPTION OF THE PREFERRED EMBODIMENTS

Figure 4A:
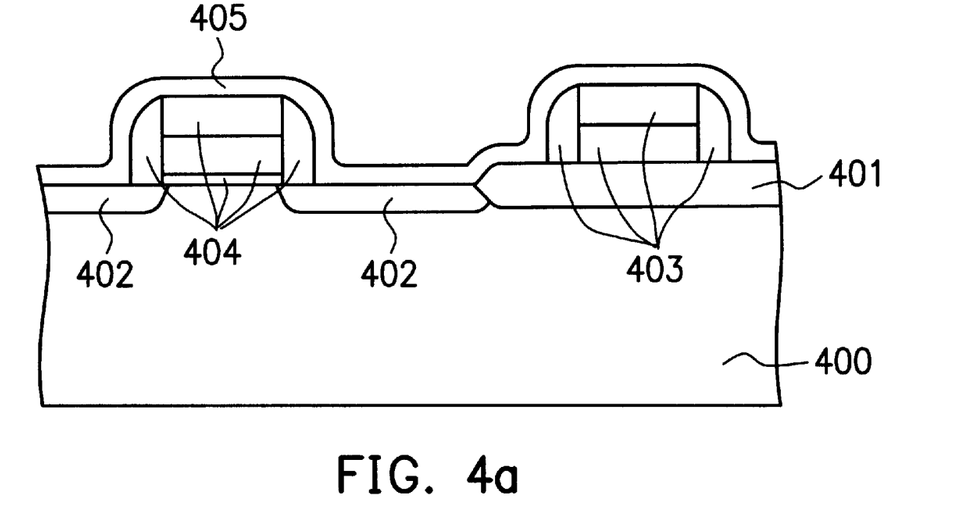
FIGS. 4a, 4b, 4c, 4d, 4e, 4f, and 4h show the cross sectional views of the process of fabricating a stacked type capacitor in a DRAM in a preferred embodiment according to the invention.

Referring to FIG. 4a, a semiconductor 400 having a MOS comprising a gate 404 and a source/drain region 402, a field oxide layer 401, and a conductive layer 403 formed thereon is provided. The conductive layer 403 is located on top of the field oxide layer 401. A first dielectric layer 405, such as a silicon nitride layer, is formed over the substrate 400.

Figure 4B:
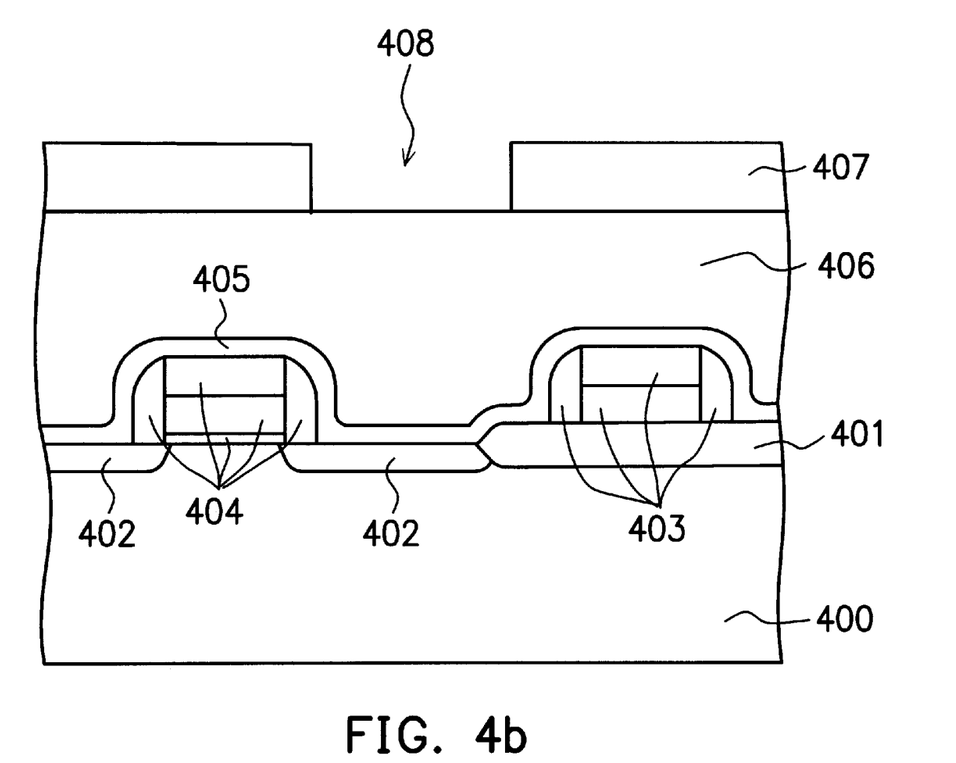

Referring FIG. 4b, an oxide layer 406 is formed on the first dielectric layer 405. A second dielectric layer 407, such as a silicon nitride layer, is formed on the oxide layer 406. Using photolithography and etching process, the second dielectric layer 407 is patterned to formed an opening 408 to expose the oxide layer 406.

Figure 4C:
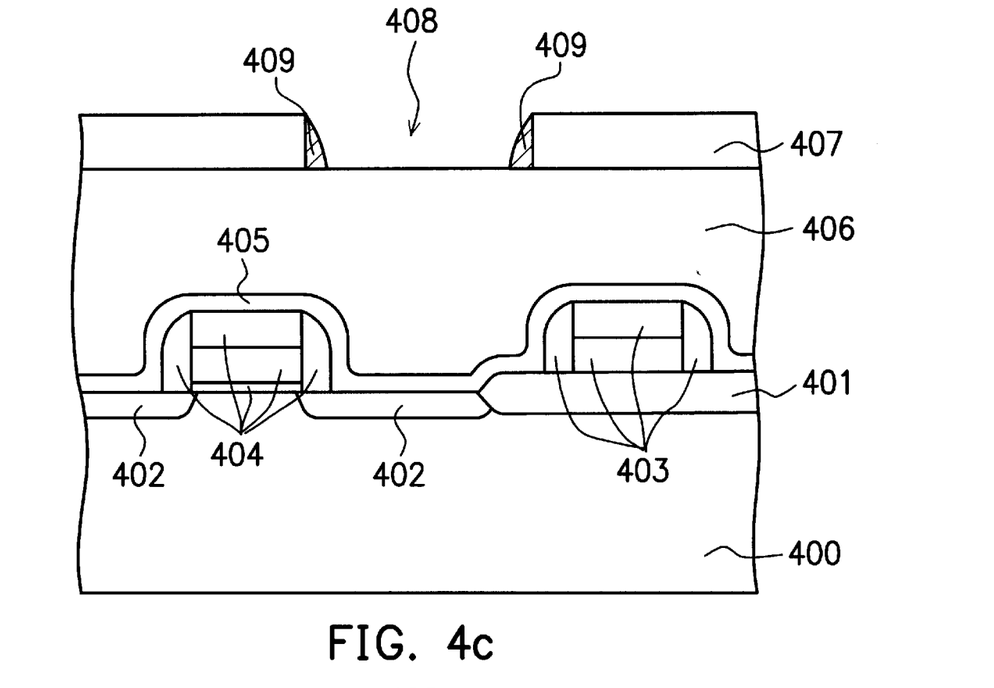

Referring to FIG. 4c, a first poly-silicon layer is formed on the second dielectric layer 407 and the opening 408. Using etching back process, a part of the first poly-silicon layer is removed to form a first spacer 409 on the side wall of the opening 408.

Figure 4D:
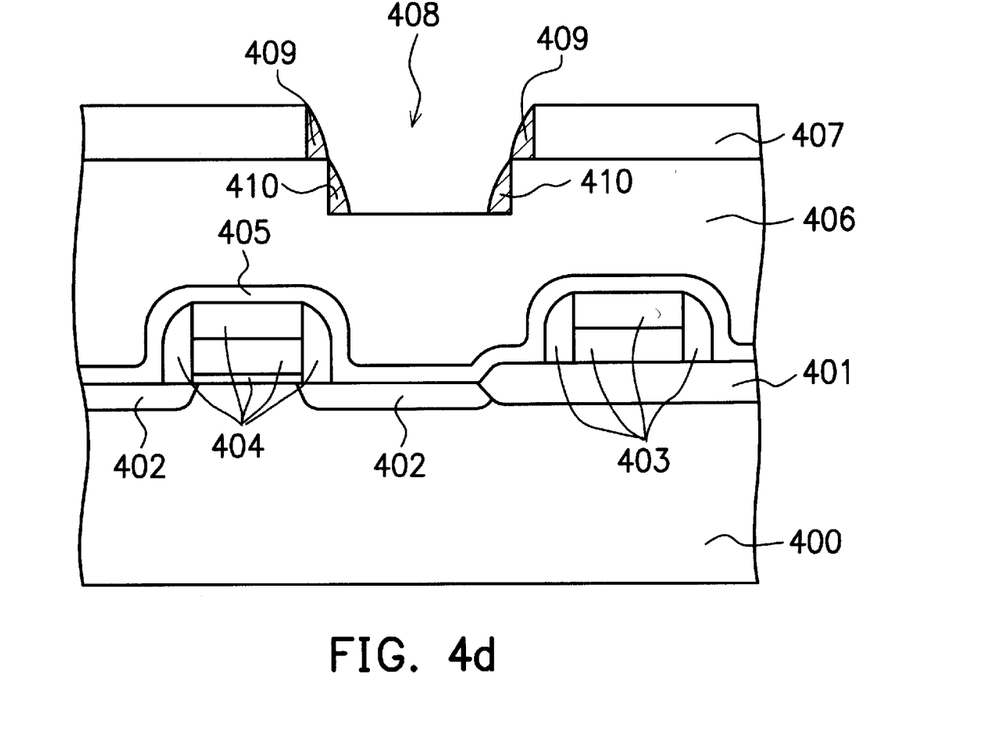

Referring to FIG. 4d, using the first spacer 409 and the second dielectric layer 407 as a mask, the oxide layer 406 is anisotropically etched until a certain level of the oxide layer 406 is etched. A second poly-silicon layer is formed on the second dielectric layer 407 and the opening 408. Using etching back process, a part of the second poly-silicon layer is removed to form a second spacer 410 on the side wall of the oxide layer 406.

Figure 4E:
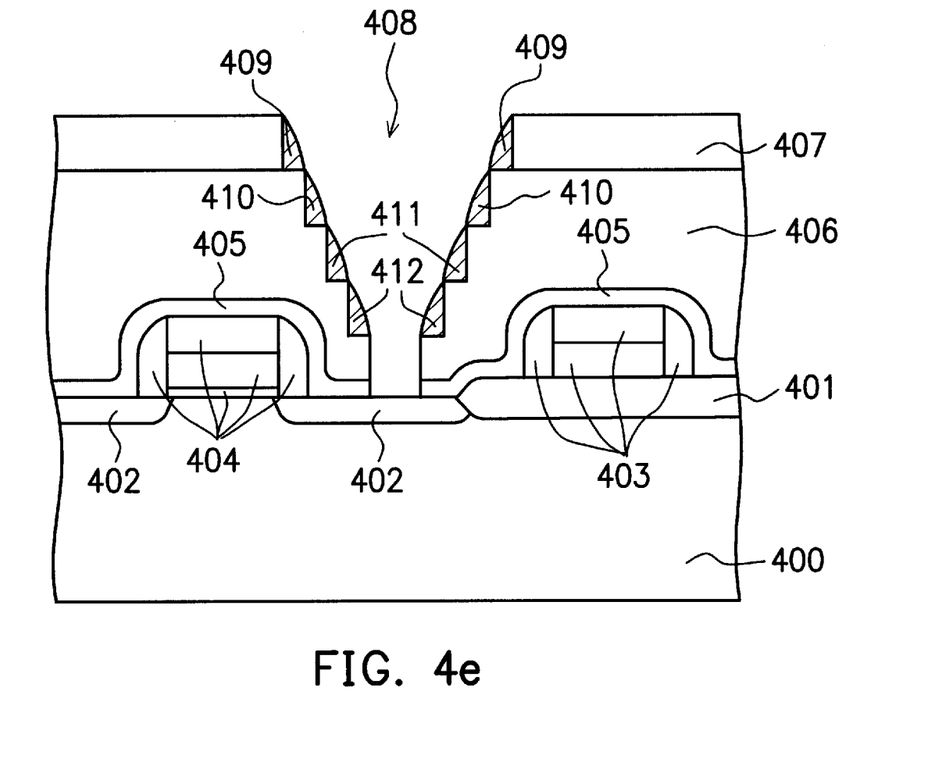

Referring to FIG. 4e, using the first spacer 409, second spacer 410, and the second dielectric layer 407 as a mask, the formation of the third 411, fourth 412, and the following spacers are formed by the same process until the source/drain region 402 is exposed.

Figure 4F:
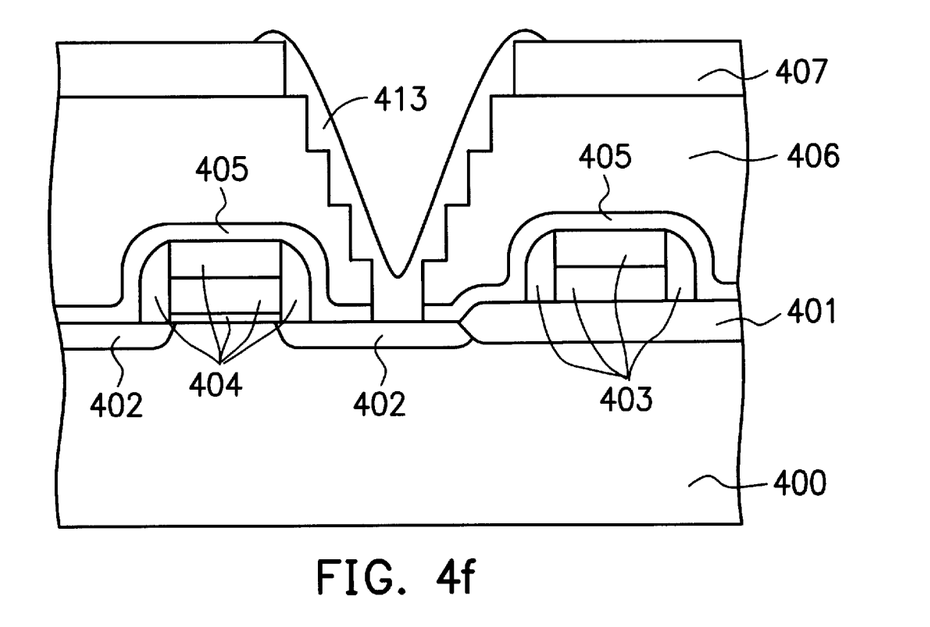
Figure 4G:
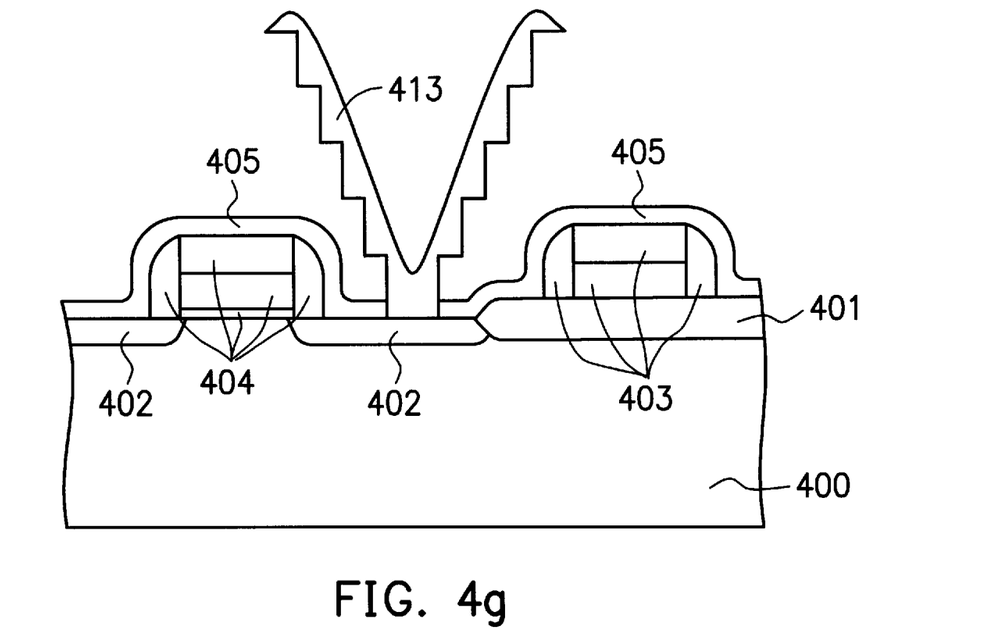

Referring to FIG. 4f, using selective epitaxy growth, an epitaxy layer 413 is formed as an inclined wall in the opening 408. Referring to FIG. 4g, the second dielectric layer 407, the oxide layer 406 are removed, for example, by wet etching. A step structured epitaxy layer 413 is formed as a bottom electrode of a capacitor in a DRAM.

Figure 4H:
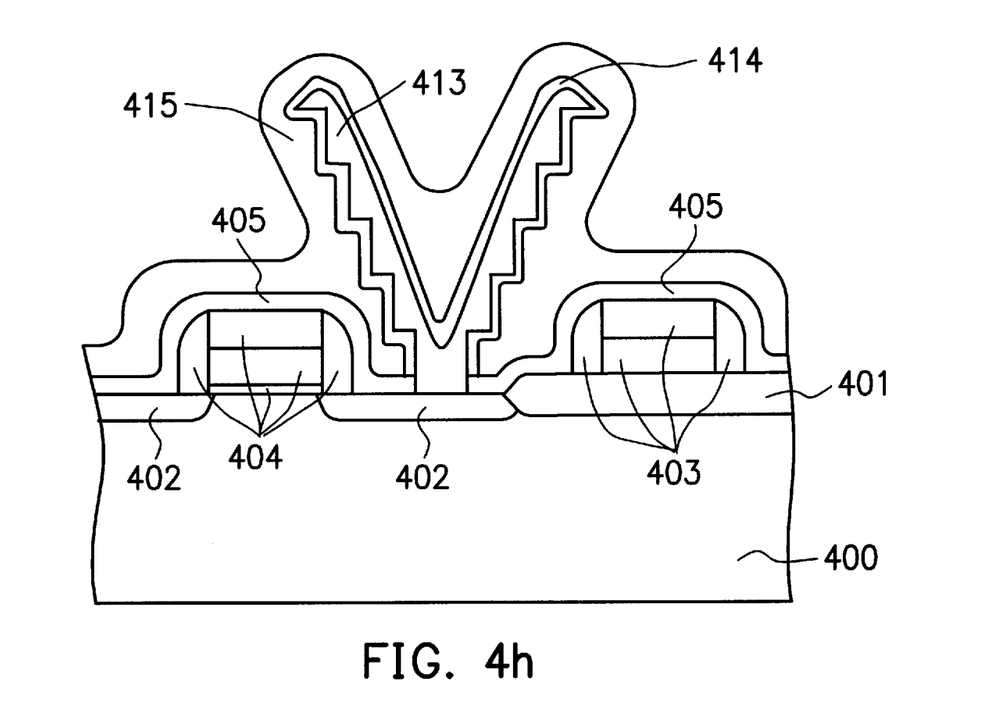

Referring to FIG. 4h, a dielectric layer 414, such as an oxide/nitride (ON) layer or an ONO layer, having a thickness of about 50 Å to 60 Å is formed on the bottom electrode 413. The dielectric layer 414 is formed by, for example, using thermal oxidation to form a silicon oxide layer first before and after the formation of a nitride layer. Using chemical vapour deposition, a top electrode 415 having a thickness of about 500 Å to 1000 Å is formed on the dielectric layer 414.

Figure 5:
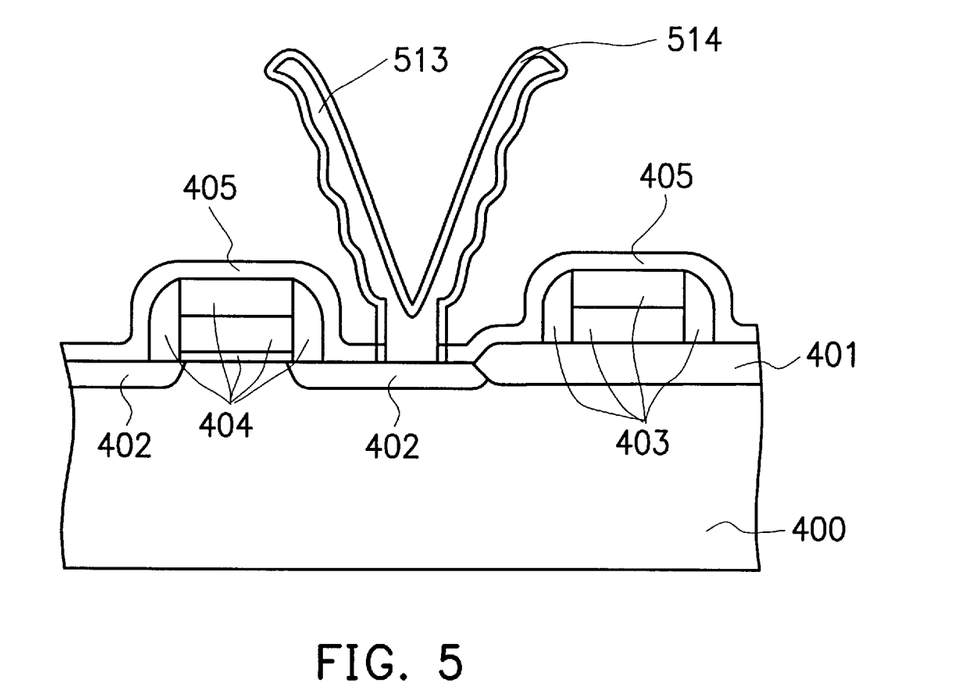
FIG. 5 shows the cross sectional view of the process of fabricating a capacitor with a right angle removed step.

The surface gain of the capacitor with a step structured bottom electrode in the invention is about twice of a capacitor fabricated by a conventional process. In addition, the method to remove the right angle of the step structured bottom electrode is shown as FIG. 5. After the formation of the structure shown on FIG. 4g, performing selective epitaxy, the right angle of the bottom electrode 513 is blunted. As shown in FIG. 5, a dielectric layer 514 and a top electrode are then formed.

Figure 6:
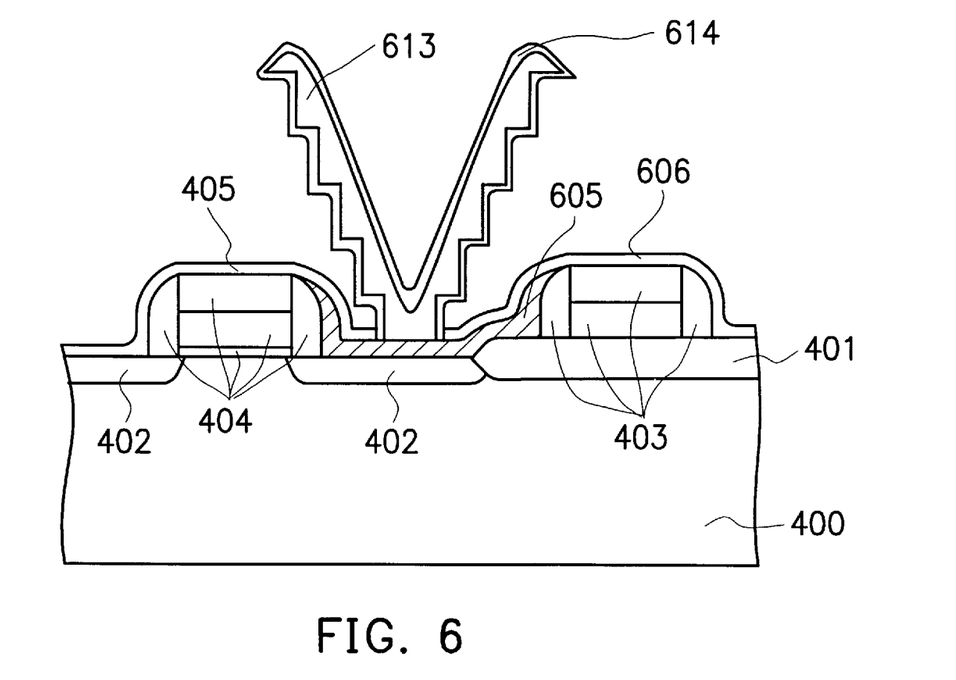
FIG. 6 shows a cross sectional view of a capacitor with an increase surface area to improve the alignment in another preferred embodiment according to the invention.

The capacitor fabricated in another embodiment according to the invention is shown as FIG. 6. A substrate 400 having a MOS which comprises a gate 404 and a source/drain region 402, a field oxide layer 401, and a first conductive layer 403 on top of the field oxide layer 401. A second conductive layer 605, such as a poly-silicon layer is formed over the substrate 400. Using photolithography and etching, a part of the second conductive layer 605 is removed, and only the source/drain 402 is covered by the second conductive layer 605.

A first dielectric layer 606 is formed over the substrate 400 and the second conductive layer 605. The same process for forming a bottom electrode 613, a dielectric layer, and a top electrode 614 as the above embodiment is performed.

While etching through the oxide layer, the opening is narrower and narrower as the process performed deeper and deeper. A misalignment between the opening and the source/drain region may occur. In the embodiment, the material of the second conductive layer is the same as the source/drain region. The formation of the second conductive layer increases the contact surface area between the source/drain region and the bottom electrode. A higher capacitance is obtained without the problem of misalignment.

Therefore, one of the characteristics of the invention is to use a step of photolithography and etching so that an opening is formed that penetrates through the oxide layer. By the formation of poly-silicon spacer as a mask, the oxide layer is etched. The formation of a spacer is repeated until the source/drain region is exposed. Only one mask is in use in the invention. Thus, the steps of exposure is minimised, the process is simplified, and the cost is reduced.

The other characteristic of the invention is the step structure bottom electrode increases the surface area twice as compared to the conventional capacitor. The capacitance is increased without enlarge the dimension of the device.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a stacked type capacitor, comprising:

providing a semiconductor substrate having a transistor, a field oxide layer, and a conductive layer formed on top of the field oxide layer, the transistor comprising a gate and a source/drain region;

forming a first dielectric layer over the substrate;

forming an oxide layer over the first dielectric layer;

forming a second dielectric layer on the oxide layer;

etching the second dielectric layer to form an opening therein;

forming a first poly-silicon layer on the second dielectric layer and the opening;

etching back the first poly-silicon layer to remove a part of the first poly-silicon layer, and forming a first spacer on a wall of the opening;

etching the oxide layer for a first height, by using the first spacer and the second dielectric layer as a first mask;

forming a second poly-silicon layer on the second dielectric layer and the opening;

etching back the second poly-silicon layer to remove a part of the second poly-silicon layer, and forming a second spacer on a wall of the first height in the opening;

etching the oxide layer for a second height, by using the first spacer, the second spacer, and the second dielectric layer as a second mask, and forming a third spacer;

removing the first dielectric layer to expose the source/drain region;

performing selective epitaxy growth to form an epitaxy layer on the first spacer, the second spacer, and the third spacer;

removing the second dielectric layer and the oxide layer to form a bottom electrode;

forming a third dielectric layer on the bottom electrode; and forming a top electrode on the third dielectric layer.

2. The method according to claim 1, wherein the third dielectric layer is an oxide/nitride layer.

3. The method according to claim 2, wherein the third dielectric layer is an oxide/nitride/oxide layer.

4. The method according to claim 1, wherein the third dielectric layer has a thickness of about 50 Å to 60 Å.

5. The method according to claim 1, wherein the top electrode has a thickness of about 500 Å to 1000 Å.

6. The method according to claim 1, wherein a plurality of spacers are further formed by using the formed spacers and the second dielectric layer as masks until exposing the first dielectric layer.

7. A method of fabricating a stacked type capacitor, comprising:

providing a semiconductor substrate having a transistor, a field oxide layer, and a conductive layer formed on top of the field oxide layer, the transistor comprising a gate and a source/drain region;

forming a first dielectric layer over the substrate;

forming an oxide layer on the first dielectric layer;

forming a second dielectric layer on the oxide layer;

etching the second dielectric layer to form an opening therein;

forming a first poly-silicon layer on the second dielectric layer and the opening;

etching back the first poly-silicon layer to remove a part of the first poly-silicon layer, and forming a first spacer on a wall of the opening;

etching the oxide layer for a first height, by using the first spacer and the second dielectric layer as a first mask;

forming a second poly-silicon layer on the second dielectric layer and the opening;

etching back the second poly-silicon layer to remove a part of the second poly-silicon layer, and forming a second spacer on a wall of the first height in the opening;

etching the oxide layer for a second height, by using the first spacer, the second spacer, and the second dielectric layer as a second mask, and forming a third spacer;

removing a part of the oxide layer by using the first spacer, the second spacer, the third spacer, and the second dielectric layer as a third mask;

removing the first dielectric layer to expose the source/drain region;

performing selective epitaxy growth to form an epitaxy layer on the first spacer, the second spacer, and the third spacer;

removing the second dielectric layer and the oxide layer to form a bottom electrode;

performing selective epitaxy growth;

forming a third dielectric layer on the bottom electrode; and forming a top electrode on the third dielectric layer.

8. The method according to claim 7, wherein the third dielectric layer is an oxide/nitride layer.

9. The method according to claim 7, wherein the third dielectric layer is an oxide/nitride/oxide layer.

10. The method according to claim 7, wherein the third dielectric layer has a thickness of about 50 Å to 60 Å.

11. The method according to claim 7, wherein the top electrode has a thickness of about 500 Å to 1000 Å.

12. The method according to claim 7, wherein the top electrode is formed by chemical vapor deposition.

13. The method according to claim 7, wherein a plurality of spacers are further formed by using the formed spacers and the second dielectric layer as masks until exposing the first dielectric layer.

14. A method of fabricating a stacked type capacitor, comprising:

providing a semiconductor substrate having a transistor, a field oxide layer, and a first conductive layer formed on top of the field oxide layer, the transistor comprising a gate and a source/drain region;

forming a second conductive layer over the substrate;

removing a part of the second conductive layer;

forming a first dielectric layer on the substrate and the substrate;

forming an oxide layer on the first dielectric layer;

forming a second dielectric layer on the oxide layer;

etching the second dielectric layer to form an opening therein;

forming a first poly-silicon layer on the second dielectric layer and the opening;

etching back the first poly-silicon layer to remove a part of the first poly-silicon layer, and forming a first spacer on a wall of the opening;

etching the oxide layer for a first height, by using the first spacer and the second dielectric layer as a first mask;

forming a second poly-silicon layer on the second dielectric layer and the opening;

etching back the second poly-silicon layer to remove a part of the second poly-silicon layer, and forming a second spacer on a wall of the first height in the opening;

etching the oxide layer for a second height, by using the first spacer, the second spacer, and the second dielectric layer as a second mask, and forming a third spacer;

removing a part of the oxide layer by using the first spacer, the second spacer, the third spacer, and the second dielectric layer as a third mask;

removing the first dielectric layer to expose the source/drain region;

performing selective epitaxy growth to form an epitaxy layer on the first spacer, the second spacer, and the third spacer;

removing the second dielectric layer and the oxide layer to form a bottom electrode;

forming a third dielectric layer on the bottom electrode; and forming a top electrode on the third dielectric layer.

15. The method according to claim 14, wherein the second conductive layer is a poly-silicon layer.

16. The method according to claim 14, wherein the third dielectric layer is an oxide/nitride layer.

17. The method according to claim 14, wherein the third dielectric layer is an oxide/nitride/oxide layer.

18. The method according to claim 14, wherein the third dielectric layer has a thickness of about 50 Å to 60 Å.

19. The method according to claim 14, wherein the top electrode has a thickness of about 500 Å to 1000 Å.

20. The method according to claim 14, wherein the top electrode is formed by chemical vapor deposition.

21. The method according to claim 14, wherein a plurality of spacers are further formed by using the formed spacers and the second dielectric layer as masks until exposing the first dielectric layer.

* * * * *